United States Patent
Jang

(10) Patent No.: US 7,929,355 B2
(45) Date of Patent: Apr. 19, 2011

(54) MEMORY DEVICE PERFORMING WRITE LEVELING OPERATION

(75) Inventor: Ji-Eun Jang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 594 days.

(21) Appl. No.: 11/819,815

(22) Filed: Jun. 29, 2007

(65) Prior Publication Data

US 2009/0016119 A1    Jan. 15, 2009

(30) Foreign Application Priority Data

Jan. 3, 2007   (KR) .................. 10-2007-0000424

(51) Int. Cl.
*G11C 7/00* (2006.01)
*G11C 7/10* (2006.01)
(52) U.S. Cl. .............. 365/189.05; 365/189.02
(58) Field of Classification Search ............. 365/185.13, 365/189.02, 189.05, 193, 189.14; 711/167, 711/169
See application file for complete search history.

(56) References Cited

U.S. PATENT DOCUMENTS

| 5,008,618 | A * | 4/1991 | Van Der Star ............... 714/729 |
| 5,515,383 | A * | 5/1996 | Katoozi ........................ 714/732 |
| 6,816,416 | B2 | 11/2004 | Won | |
| 7,043,672 | B2 | 5/2006 | Merritt | |
| 2004/0125659 | A1* | 7/2004 | Yoon ........................ 365/189.02 |
| 2004/0243961 | A1 | 12/2004 | Iadonato et al. | |
| 2008/0304336 | A1* | 12/2008 | Kim et al. ................ 365/189.11 |

FOREIGN PATENT DOCUMENTS

| JP | 2005-038526 | 2/2005 |
| KR | 10-0521047 | 10/2005 |

* cited by examiner

*Primary Examiner* — VanThu Nguyen
*Assistant Examiner* — Douglas King
(74) *Attorney, Agent, or Firm* — IP & T Group LLP

(57) ABSTRACT

A memory device includes a multiplexing unit, a pipe latch unit, and an output driver. The multiplexing unit outputs data input from global input/output lines in a normal mode and outputs write leveling data in a writing leveling mode being entered in response to a write leveling signal. The pipe latch unit latches the data outputted from the multiplexing unit and outputting the latched data. The output driver outputs the latched data outputted from the pipe latch unit.

8 Claims, 5 Drawing Sheets

MEMORY DEVICE PERFORMING WRITE LEVELING OPERATION

CROSS-REFERENCE TO RELATED APPLICATION

The present invention claims priority of Korean patent application number 10-2007-0000424, filed on Jan. 3, 2007, which is incorporated by reference in its entirety.

BACKGROUND OF THE INVENTION

The present invention relates to a semiconductor memory device; and, more particularly, to a memory device performing a write leveling operation introduced from a DDR3 (Double Data Rate 3) memory device.

It is known that the write leveling refers to an operation that calibrates a skew between DQS (data strobe signal) and a clock so as to improve a tDQS margin, a timing difference between the DQS and the clock, during a write operation of a memory device.

Basically, the write leveling operation is done by providing the logic state of a clock at a rising edge of DQS as data DQ after an entry into a write leveling mode by EMRS (Extended Mode Register Set) setting. In other words, if the state of a clock is a logic high level at a rising edge of DQS, a high level data is outputted as data DQ, and if the state thereof is a logic low level, a low level data is provided as data DQ.

FIG. 1 is a block diagram showing a data output unit for explaining a write leveling operation in a conventional DDR3 memory device using an 8-bit prefetch.

A normal operation will be first explained, followed by the write leveling operation. That is, a data is carried on global input/output lines GIO0 to GIO7 by a read command in a memory device.

At a multiplexing unit 10, in response to a data selection signal gaxydb<0:3>, a corresponding data is selected and the selected data GIO_MUX is outputted to a pipe latch unit 20.

The pipe latch unit 20 inputs the data GIO_MUX to the pipe latches 22 to 25 by pipe latch input signals PIN<0:3> being sequentially enabled, and latches them to output data FD0 and RD0 to an output driver 30 by pipe latch output signals POUT<0:3>. A control signal sosez used herein denotes a signal for deciding the output sequence of data latched by pipe latches 22 to 25 included in the pipe latch unit 20. For reference, RD0 in the drawing means data for rising edge and FD0 means data for falling edge.

The operation in the write leveling mode will now be described in detail. First, if the write leveling mode is selected by EMRS setting, a pipe-out circuit 21 included in the pipe latch unit 20 is open by an inverted signal dqslevb of a write leveling signal dqslev being activated and write level data level_data is outputted to the output driver 30 through the pipe-out circuit 21. The write level data level_data herein is the one with the state of a clock at a rising edge of DQS.

Further, in the write leveling mode, the pipe latch input signals PIN<0:3> and the pipe latch output signals POUT<0:3> are all disabled, thereby making all of the pipe latches 22 to 25 excluding the pipe-out circuit 21 closed.

As described above, the conventional memory device is made in a manner that the pipe latch unit 20 is in charge of the output of the write leveling data level_data in the write leveling mode.

FIG. 2 offers a detailed circuit diagram of the pipe-out circuit 21 depicted in FIG. 1.

The pipe-out circuit 21 has the same structure as the output part of the pipe latches 22 to 25. In operation, if the current operation mode becomes the write leveling mode, an inverted signal dqslevb of a write leveling signal is inputted with a logic low level. In response to this, transistors P21 and N22 are turned on, which enables inverters P22 and N21 to output the write leveling data level_data to a node RD0.

In a normal mode, since the inverted signal dqslevb of the write leveling signal is a logic high level, the transistors P21 and N22 are turned off, which enables the inverters P22 and N21 not to output the write leveling data level_data.

FIG. 3 describes a detailed circuit diagram of the multiplexing unit 10 shown in FIG. 1.

In particular, FIG. 3 shows one multiplexer 0 out of the multiplexers 0 to 7 included in the multiplexing unit 10. The conventional multiplexer 0 is configured to include pass gates PG31, PG32, PG33 and PG34 which are turned on depending on the data selection signals gaxydb<0:3> and deliver data on global input/output lines GIO0_0 to GIO0_3 to an output end GIO_MUX0 of the multiplexer 0, but is not concerned in the operation in the write leveling mode.

As set forth above, the conventional memory device is implemented in such a way that the pipe latch unit 20 participates in the write leveling operation. For this, the pipe latch unit 20 is provided with the pipe-out circuit 21 having a relatively large size, thereby causing damage to layout.

In addition, since the pipe latch unit 20 is provided with the pipe-out circuit 21 to participate in the write leveling operation, it increases loading of lines RD0 and FD0 that are output ends of the pipe latch unit 20. As a result, this results in a loss in a tAA value (which is a performance factor representing the speed of data to be outputted from a read command).

SUMMARY OF THE INVENTION

Embodiments of the present invention are directed to providing a semiconductor memory device performing a write leveling operation by calibrating a skew between a data strobe signal and a clock signal.

In accordance with an aspect of the present invention, there is provided a memory device including a multiplexing unit, a pipe latch unit, and an output driver. The multiplexing unit outputs data input from global input/output lines in a normal mode and outputs write leveling data in a writing leveling mode being entered in response to a write leveling signal. The pipe latch unit latches the data outputted from the multiplexing unit and outputting the latched data. The output driver outputs the latched data outputted from the pipe latch unit.

BRIEF DESCRIPTION OF THE DRAWINGS

FIG. 1 is a block diagram showing a data output unit for explaining a write leveling operation in a conventional DDR3 memory device using an 8-bit prefetch.

FIG. 2 is a detailed circuit diagram of the pipe-out circuit 21 depicted in FIG. 1.

FIG. 3 is a detailed circuit diagram of the multiplexing unit shown in FIG. 1.

FIG. 4 is a structural block diagram of a memory device performing a write leveling operation in accordance with a preferred embodiment of the present invention.

FIG. 5 is a detailed circuit diagram illustrating one example of the multiplexing unit shown in FIG. 4.

DESCRIPTION OF SPECIFIC EMBODIMENTS

Hereinafter, a preferred embodiment of the present invention will be described in detail with reference to the accompanying drawings so that the invention can be easily carried out by those skilled in the art to which the invention pertains.

Figure 4:
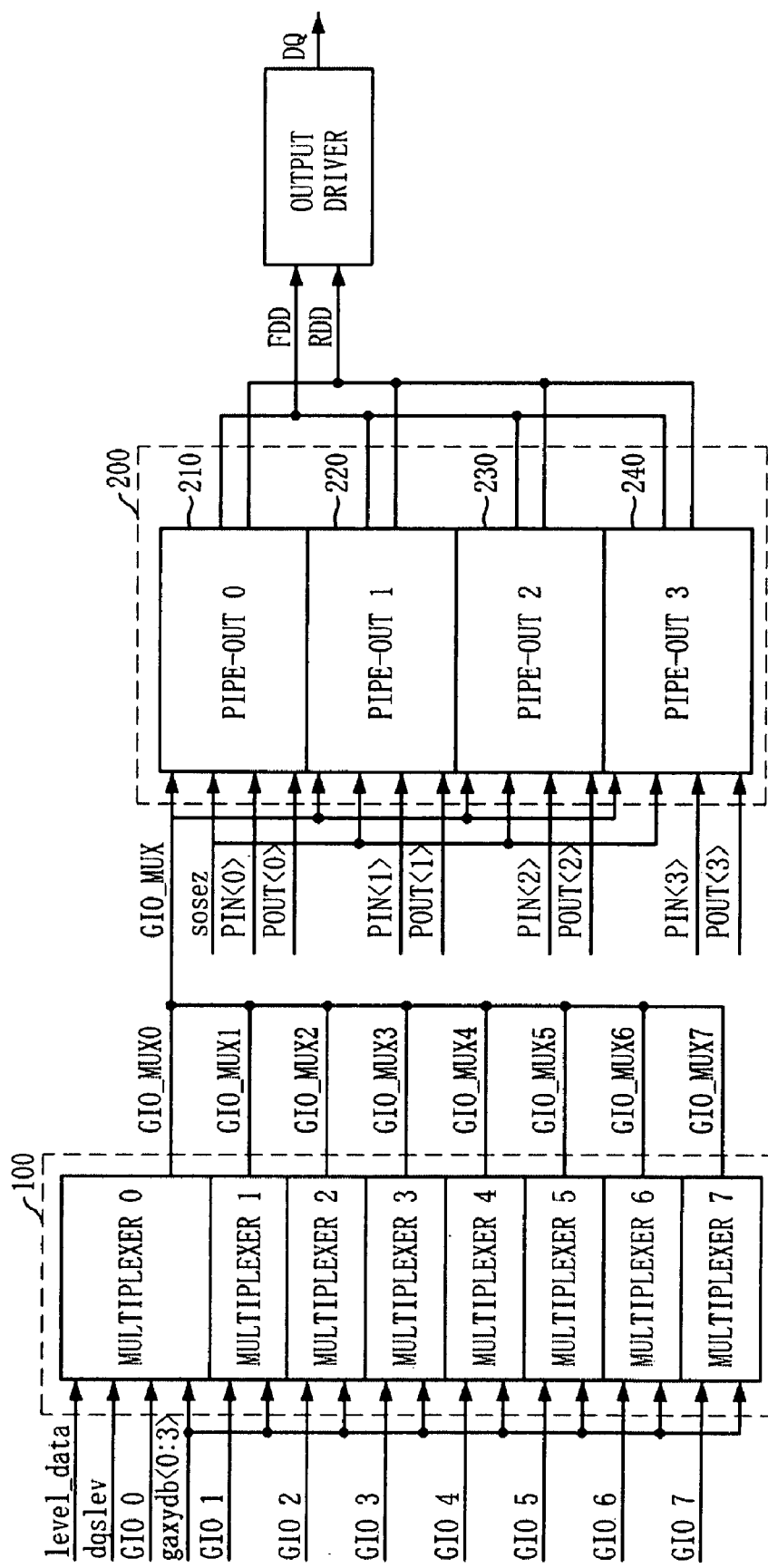

FIG. 4 is a structural block diagram of a memory device performing a write leveling operation in accordance with a preferred embodiment of the present invention.

As shown in FIG. 4, the memory device performing the write leveling operation according to the present invention includes a multiplexing unit 100, a pipe latch unit 200 and an output driver 300.

The multiplexing unit 100 selectively outputs data delivered to global input/output lines GIO0 to GIO7 in a normal mode, while outputting write leveling data level_data in a writing leveling mode being entered in response to an input of a write leveling signal dqslev. That is, unlike the prior art, the present invention is in charge of the main functions of the write leveling operation in the multiplexing unit 100, rather than the pipe latch unit 200. Details of the multiplexing unit 100 will be given later in conjunction with FIG. 5.

The pipe latch unit 200 latches data GIO_MUX outputted from the multiplexing unit 100 and outputs the latched data to the output driver 300. That is, it latches the data GIO_MUX outputted from the multiplexing unit 100 and outputs it to the output driver 300 in the normal mode, while only one pipe is open for transferring the write leveling data level_data outputted from the multiplexing unit 100 (to be outputted to the GIO_MUX end) to the output driver 300 in the write leveling mode.

More specifically, the pipe latch unit 200 takes and latches the data GIO_MUX outputted from the multiplexing unit 100 via each of pipes 210 to 240 in response to the pipe latch input signals PIN<0:3>, and outputs the data latched by each of the pipes 210 to 240 by the pipe latch output signals POUT<0:3>. Therefore, since only one pipe is open in the write leveling mode, one of the pipe latch input signals PIN<0:3> and one of the pipe latch output signals POUT<0:3> are set to be enabled in the write leveling mode. For example, if only the pipe latch 0 210 is intended to be open in the write leveling mode, only PIN<0> and POUT<0> out of the pipe latch input signals PIN<0:3> and the pipe latch output signals POUT<0:3> are set to be enabled.

Since the multiplexing unit 100 takes the place of the role of the pipe-out circuit that was in the conventional pipe latch unit, the pipe-out circuit is no longer needed.

The process of setting one of the pipe latch input signals PIN<0:3> and one of the pipe latch output signals POUT<0:3> so that only one pipe is open in the write leveling mode can be easily implemented by those skilled in the art, and therefore, details thereof will be omitted here for simplicity.

The output driver 300 is a driver which takes the data from the pipe latch unit 200 and then outputs it to a data terminal DQ.

Figure 5:
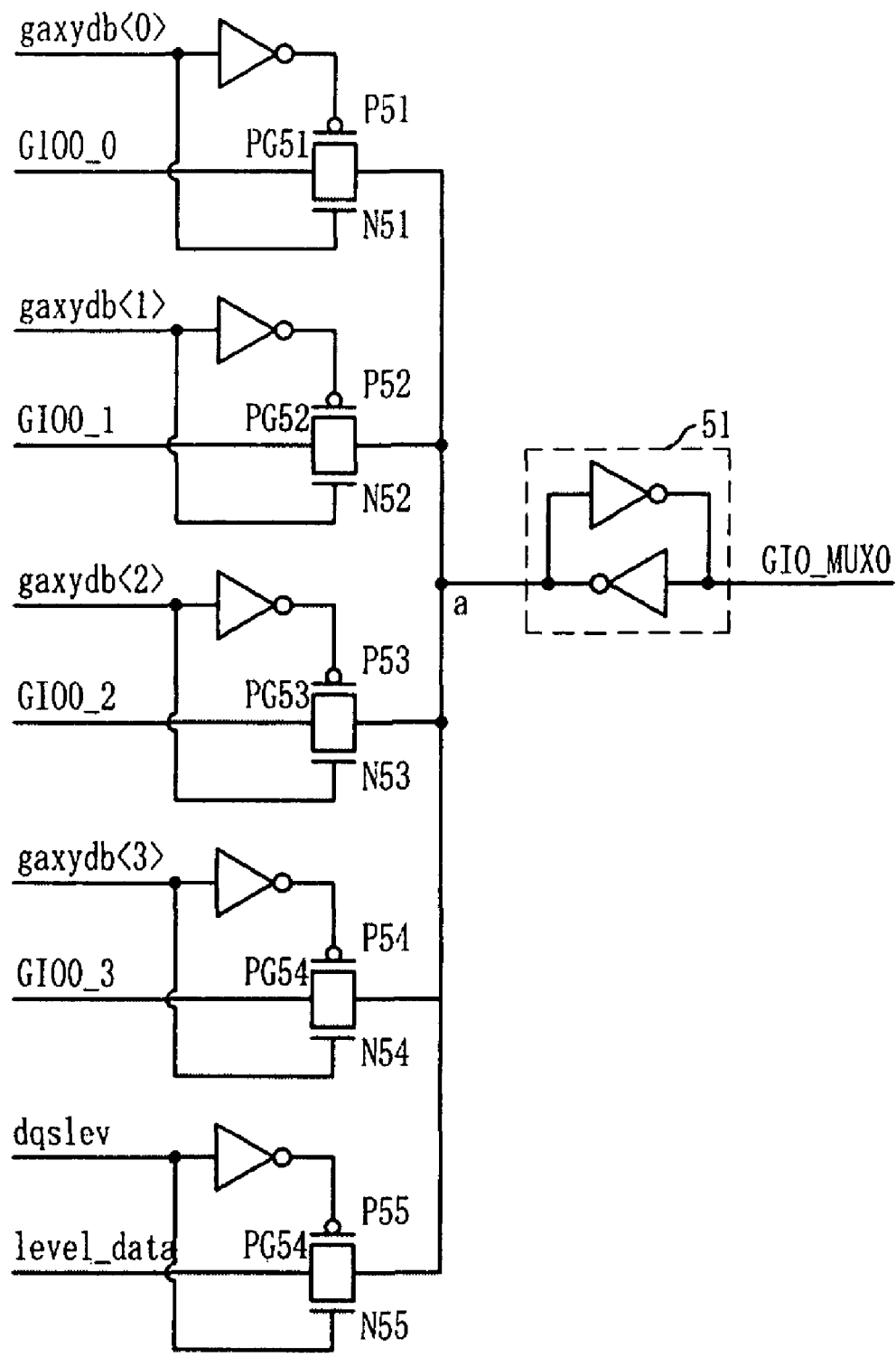

FIG. 5 is a detailed circuit diagram illustrating one example of the multiplexing unit 100 depicted in FIG. 4.

The multiplexing unit 100 selects and outputs data delivered to the global input/output lines GIO0 to GIO7 by the data selection signal gaxydb<0:3> in the normal mode, while outputting the write leveling data level_data when the rite leveling signal dqslev notifying that the current operation mode is the write leveling mode is inputted.

FIG. 5 illustrates the multiplexer 0 among the multiplexers 0 to 7 included in the multiplexing unit 100, and as shown therein, the multiplexer 0 may be configured by including general pass gates PG51, PG52, PG53 and PG54 which are turned on or off when the data selection signals gaxydb<0:3> are inputted and output data on the global input/output lines GIO0_0 to GIO0_3, and a pass gate PG55 which is turned on or off when the write leveling signal dqslev is inputted and outputs the write leveling data level_data.

Figure 1:
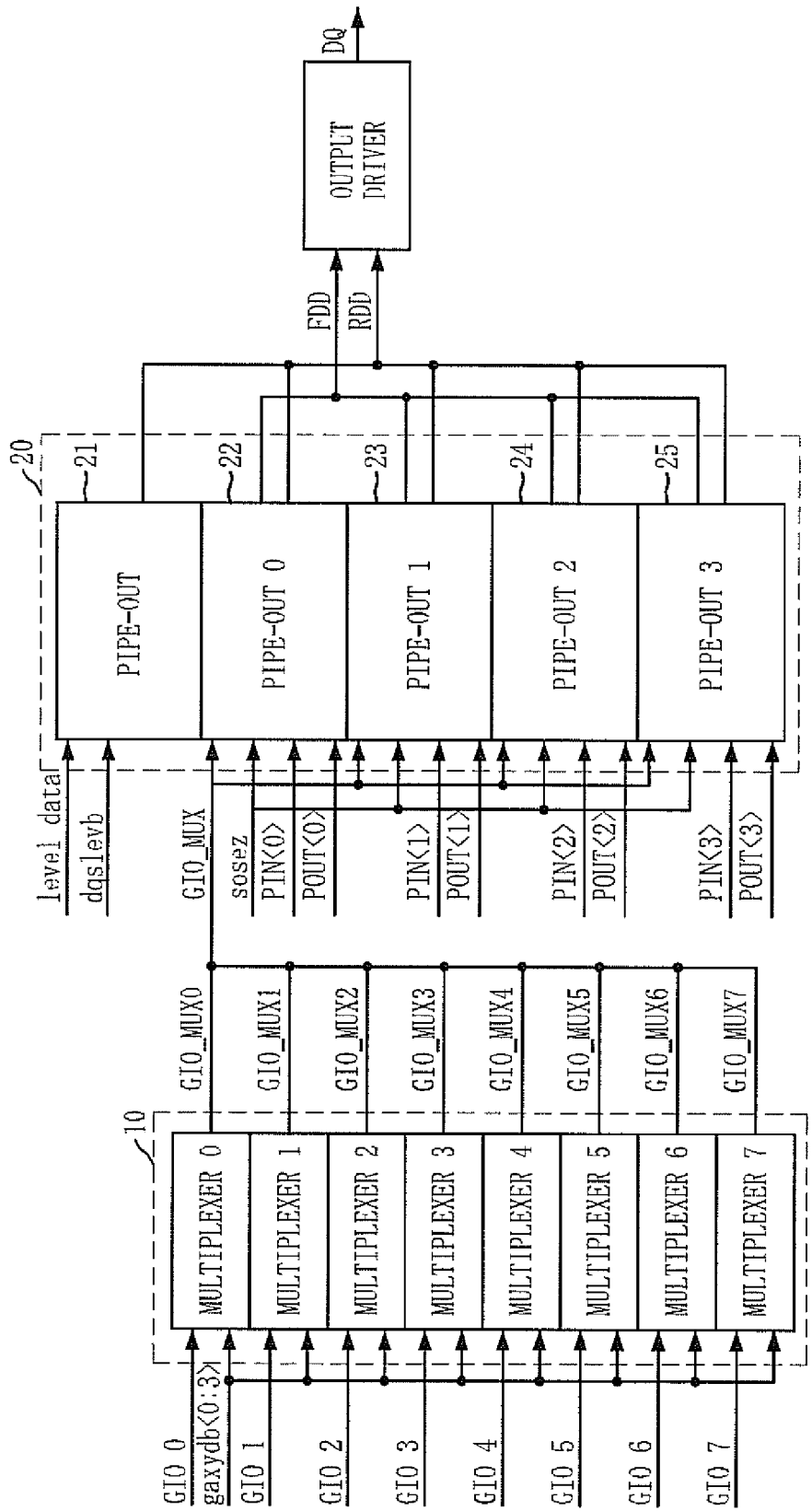
Figure 2:
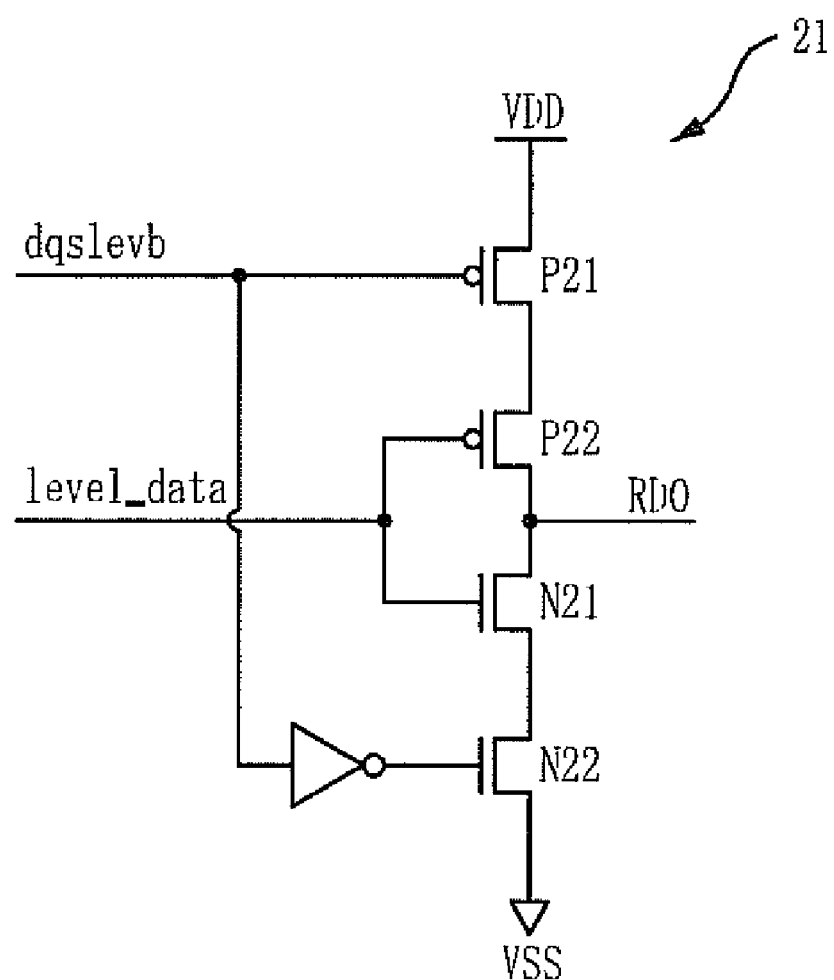
Figure 3:
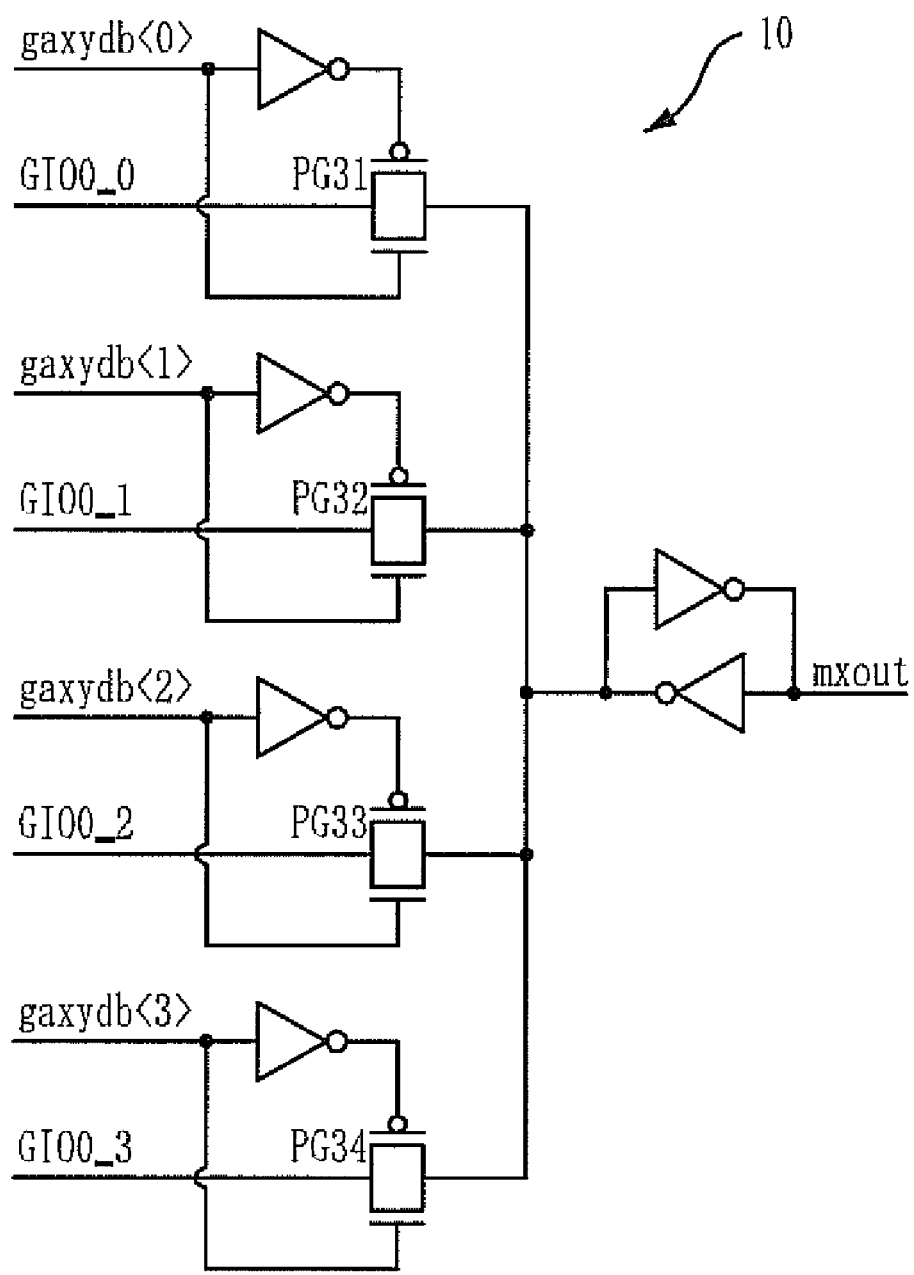

In a preferred embodiment of the invention, it is possible to be provided with only one pass gate PG55 for outputting the write leveling data level_data in the entire multiplexing unit 100. Therefore, the multiplexing unit 100 may be configured by being provided with the general 32 (4*8) pass gates (such as PG51 to PG54), and the pass gate PG55 for outputting the write leveling data level_data in its entirety, when configuring the multiplexing unit as in FIG. 3.

The pass gates PG51 to PG 54 for outputting the data of the global input/output lines GIO0_0 to GIO0_3 are composed of NMOS transistors N51 to N54 whose each gate receives one of the data selection signals gaxydb<0:3> and each drain-source transmission line connects a corresponding one of the global input/output lines GIO0_0 to GIO0_3 to a node a at an output end, and PMOS transistors P51 To P54 whose each gate receives an inverted signal of one of the data selection signals gaxydb<0:3> and each drain-source transmission line connects a corresponding one of the global input/output lines GIO0_0 to GIO0_3 to a node a at an output end.

Further, the pass gate PG55 for outputting the write leveling data level_data newly added in the present invention is composed of an NMOS transistor N55 whose gate receives the write leveling signal dqslev and drain-source transmission line connects the write leveling data level_data to the node a at the output end, and a PMOS transistor P55 whose gate receives an inverted signal of the write leveling signal dqslev and drain-source transmission line connects the write leveling data level_data to the node a at the output end.

In operation, if the data selection signal gaxydb<0:3> is enabled to a logic high level in the normal mode, the pass gates PG51 to PG54 corresponding to the respective selection signals are open and the data of the global input/output lines GIO0_0 to GIO0_3 is delivered to the node a at the output end. However, the write leveling signal dqslev is enabled to a logic high level in the write leveling mode, and thus, the pass gate PG55 is turned on to transfer the write leveling data level_data to the node a at the output end.

The write leveling mode is a mode for outputting the write leveling data level_data, not the data of the global input/output lines GIO0_0 to GIO0_3. Therefore, the data selection signals gaxydb<0:3> are set to be all disabled in the write leveling mode. In other words, the data selection signals gaxydb<0:3> are made by combining x13 and y14 addresses, and if the write leveling signal dqslev is enabled when combining these, the data selection signals gaxydb<0:3> are set to be all disabled.

For reference, two inverters 51 that are arranged at the output end are to latch data outputted from the multiplexer 0.

As described above, the present invention is in charge of the write leveling mode operation of the memory device in the multiplexing unit, not the existing pipe latch unit, thereby making it possible to reduce the area of the pipe latch unit.

In addition, the pipe-out circuit is eliminated from the pipe latch unit to decrease loading on the RD0 and FD0 lines that are the output ends of the pipe latch unit, so that a tAA value can be improved.

While the present invention has been described with respect to the specific embodiments, it will be apparent to those skilled in the art that various changes and modifications may be made without departing from the spirit and scope of the invention as defined in the following claims.

What is claimed is:

1. A memory device, comprising:
   a multiplexing unit for outputting data input from global input/output lines in response to a data selection signal received in a normal mode and outputting write leveling data in response to a write leveling signal received in a write leveling mode, wherein the multiplexing unit includes a first multiplexer and a plurality of second multiplexers;

a pipe latch unit for latching the data outputted from the multiplexing unit and outputting the latched data; and an output driver for receiving and outputting the latched data, wherein the first multiplexer includes
- a first pass gate configured to be turned on or off in response to the data selection signal and output the data input from the global input/output lines, and
- a second pass gate configured to be turned on or off in response to the write leveling signal and output the write leveling data, and wherein each of the second multiplexers includes a first pass gate configured to be turned or off in response to the data selection signal and output the data input from the global input/output lines.

2. The memory device as recited in claim 1, wherein the write leveling data is data representing a logic state of a clock at a rising edge of a data strobe signal.

3. The memory device as recited in claim 2, wherein the data selection signal is disabled when the write leveling signal is inputted.

4. The memory device as recited in claim 3, wherein the first pass gates of the first multiplexer and the second multiplexers each includes:

an NMOS transistor having a gate to receive the data selection signals and a drain-source junction to connect a corresponding one of the global input/output lines to an output node; and PMOS transistor having a gate to receive an inverted signal of the data selection signals and a drain-source junction to connect a corresponding one of the global input/output lines to the output node.

5. The memory device as recited in claim 3, wherein the second pass gate includes:

an NMOS transistor having a gate to receive the write leveling signal and drain-source junction to transfer the write leveling data to an output node; and a PMOS transistor having a gate to receive an inverted signal of the write leveling signal and drain-source junction to transfer the write leveling data to the output node.

6. The memory device as recited in claim 1, wherein the pipe latch unit includes a plurality of pipe latches and all but one of the pipe latches are configured to be disabled from latching and outputting the data outputted from the multiplexing unit in the write leveling mode.

7. The memory device as recited in claim 6, wherein the pipe latch unit is configured to latch the data outputted from the multiplexing unit depending on pipe latch input signal and outputs the latched data to the output driver depending on pipe latch output signals.

8. The memory device as recited in claim 7, wherein the pipe latch unit includes a plurality of pipe latches and all but one of the pipe latches are configured to be disabled from latching and outputting the data outputted from the multiplexing unit in response to the pipe latch input signals and the pipe latch output signal.

* * * * *